(12) United States Patent
Roggero et al.

(10) Patent No.: US 8,582,618 B2
(45) Date of Patent: Nov. 12, 2013

(54) SURFACE-EMITTING SEMICONDUCTOR LASER DEVICE IN WHICH AN EDGE-EMITTING LASER IS INTEGRATED WITH A DIFFRACTIVE OR REFRACTIVE LENS ON THE SEMICONDUCTOR LASER DEVICE

(75) Inventors: Guido Alberto Roggero, Turin (IT); Rui Yu Fang, Turin (IT); Alessandro Stano, Ciriè (IT); Giuliana Morello, Turin (IT)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 287 days.

(21) Appl. No.: 13/008,239

(22) Filed: Jan. 18, 2011

(65) Prior Publication Data

US 2012/0183007 A1    Jul. 19, 2012

(51) Int. Cl.
    *H01S 5/026*    (2006.01)
(52) U.S. Cl.
    USPC ............ 372/50.23; 372/43.01; 372/50.1; 372/50.11; 372/49.01
(58) Field of Classification Search
    USPC ........... 372/50.23, 43.01, 50.1, 50.11, 49.01
    See application file for complete search history.

(56) References Cited

U.S. PATENT DOCUMENTS

| | | |
|---|---|---|
| 4,733,094 A | 3/1988 | Carpentier et al. |
| 4,821,997 A | 4/1989 | Zdeblick |
| 4,893,296 A * | 1/1990 | Matsumoto et al. ...... 369/112.27 |
| 4,990,465 A | 2/1991 | Liau et al. |
| 5,100,220 A | 3/1992 | Voegeli |
| 5,159,603 A | 10/1992 | Kim |
| 5,218,584 A * | 6/1993 | Gfeller ...................... 369/44.12 |
| 5,463,649 A | 10/1995 | Ashby et al. |
| 5,671,243 A | 9/1997 | Yap |

(Continued)

FOREIGN PATENT DOCUMENTS

| | | |
|---|---|---|
| CN | 1595741 | 3/2005 |
| DE | 3914835 | 5/1989 |

(Continued)

OTHER PUBLICATIONS

Park, J.; Lee, T.; Lee, D.; Kim, S.; Chung, Y., Hybrid-integrated tunable laser using polymer coupled-ring reflector, IEEE Xplore; Dec. 4, 2008, pp. 1464-1466, vol. 44 Issue 25, IEEE.

(Continued)

*Primary Examiner* — Jessica Stultz
*Assistant Examiner* — Joshua King

(57) ABSTRACT

A surface-emitting semiconductor laser device that includes an edge-emitting laser formed in layers of semiconductor material disposed on a semiconductor substrate, a polymer material disposed on the substrate laterally adjacent the layers in which the edge-emitting laser is formed, a diffractive or refractive lens formed on an upper surface of the polymer material, a side reflector formed on an angled side reflector facet of the polymer material generally facing an exit end facet of the laser, and a lower reflector disposed on the substrate beneath the polymer material. Laser light passes out of the exit end facet and propagates through the polymer material before being reflected by the side reflector toward the lower reflector. The laser light is then re-reflected by the lower reflector towards the lens, which directs the laser light out the device in a direction that is generally normal to the upper surface of the substrate.

18 Claims, 8 Drawing Sheets

(56) References Cited

U.S. PATENT DOCUMENTS

| | | | |
|---|---|---|---|
| 5,912,872 A | 6/1999 | Feldman et al. | |
| 5,987,202 A | 11/1999 | Gruenwald et al. | |
| 6,066,859 A | 5/2000 | Stegmueller | |
| 6,101,204 A | 8/2000 | Johnston | |
| 6,459,716 B1 * | 10/2002 | Lo et al. | 372/50.1 |
| 6,722,792 B2 | 4/2004 | Raj et al. | |
| 6,940,885 B1 | 9/2005 | Cheng et al. | |
| 6,973,110 B2 | 12/2005 | Althaus et al. | |
| 7,122,391 B2 | 10/2006 | Kuzma | |
| 7,245,645 B2 | 7/2007 | Behfar et al. | |
| 7,450,621 B1 * | 11/2008 | Tallone et al. | 372/43.01 |
| 7,450,623 B2 * | 11/2008 | O'Daniel et al. | 372/50.11 |
| 7,502,403 B2 * | 3/2009 | Shinoda et al. | 372/50.23 |
| 7,738,522 B2 | 6/2010 | Henrichs | |
| 7,750,356 B2 | 7/2010 | Wang | |
| 7,760,782 B2 * | 7/2010 | Aoki | 372/44.01 |
| 8,315,287 B1 * | 11/2012 | Roggero et al. | 372/50.11 |
| 2002/0003824 A1 | 1/2002 | Lo et al. | |
| 2002/0003842 A1 * | 1/2002 | Suzuki et al. | 375/259 |
| 2002/0159491 A1 | 10/2002 | Jiang et al. | |
| 2002/0163865 A1 | 11/2002 | Zimmer | |
| 2004/0066817 A1 | 4/2004 | Ungar | |
| 2004/0101020 A1 | 5/2004 | Bhandarkar | |
| 2004/0146236 A1 | 7/2004 | Fang et al. | |
| 2005/0001282 A1 | 1/2005 | Steinberg | |
| 2005/0062122 A1 | 3/2005 | Gallup et al. | |
| 2005/0285131 A1 | 12/2005 | Gallup et al. | |
| 2005/0285242 A1 | 12/2005 | Gallup | |
| 2006/0239319 A1 | 10/2006 | Kozlovsky et al. | |
| 2006/0291516 A1 | 12/2006 | Aoki | |
| 2007/0047609 A1 | 3/2007 | Francis et al. | |
| 2010/0034223 A1 | 2/2010 | Osinski et al. | |
| 2010/0290489 A1 | 11/2010 | Agresti et al. | |
| 2011/0079893 A1 | 4/2011 | Sherrer | |
| 2012/0183007 A1 | 7/2012 | Roggero et al. | |

FOREIGN PATENT DOCUMENTS

| | | |
|---|---|---|
| DE | 19510559 | 3/1995 |
| DE | 10305171 | 8/2004 |
| DE | 102005031132 | 7/2005 |
| EP | 0445488 | 9/1991 |
| EP | 515364 | 3/2005 |
| GB | 2369725 | 6/2002 |
| GB | 2488399 | 8/2012 |
| JP | 62158377 | 7/1987 |
| JP | 2231786 A | 9/1990 |
| JP | 2000196173 | 7/2000 |
| WO | WO-02089276 | 11/2002 |
| WO | WO-2004049521 | 6/2004 |

OTHER PUBLICATIONS

Hans, L. A. et al., "Microsystems and Wafer Processes for volume Production Reliable Fiber Optic Components for Telecom-and Datacom-Application", *IEEE Transactions on Components, Packaging and Mfg. Tech.—Part B*, vol. 21, No. 2 May 1998, 147-156.

* cited by examiner

SURFACE-EMITTING SEMICONDUCTOR LASER DEVICE IN WHICH AN EDGE-EMITTING LASER IS INTEGRATED WITH A DIFFRACTIVE OR REFRACTIVE LENS ON THE SEMICONDUCTOR LASER DEVICE

TECHNICAL FIELD OF THE INVENTION

The invention relates generally to semiconductor laser devices and, more particularly, to a surface-emitting semiconductor laser device in which an edge-emitting laser and a diffractive or refractive lens are integrated together on the same chip.

BACKGROUND OF THE INVENTION

Semiconductor lasers are commonly used in optical transceivers for telecommunications and data communication networks. The lasers used in such optical transceivers are commonly of the edge-emitting type. The edge-emitting laser of an optical transceiver is commonly coupled to the fiber with an aspheric lens or other discrete optical element because the light that the laser emits is not focalized or collimated, i.e., it diverges in a cone shape as it propagates. While the use of lenses to couple edge-emitting lasers to fibers in optical transceivers works reasonably well, it would be desirable to improve transceiver manufacturing economy by minimizing the number of transceiver parts and the attendant steps needed to achieve optical alignment among them.

Edge-emitting lasers for optical transceivers are fabricated on semiconductor wafers using standard photolithographic and epitaxial methods, diced into chips, and portions of each chip coated with reflective and anti-reflective coatings. The finished chips can then be tested. It would be desirable to minimize the number of manufacturing steps as well as to enhance testability.

It has also been proposed to integrate a diffractive lens and an edge-emitting laser on the same chip. For example, U.S. Pat. No. 6,459,716 to Lo et al. discloses a device in which an edge-emitted beam produced by an edge-emitting laser is reflected by an angled surface toward a lower reflective surface that is parallel to the beam-emission direction and parallel to the chip surface, which, in turn, reflects the beam upwardly in a direction generally perpendicular to the chip surface. The upwardly reflected beam is then emitted through a diffractive lens formed in a material on the chip surface. A transceiver having such a device can be manufactured more economically than one in which a separate lens is included. Nevertheless, the device is not straightforward to fabricate due to the inclusion of a waveguide to direct the beam from the laser toward the angled surface. Also, the geometry of the device may make its optical characteristics sensitive to wafer thickness errors.

Vertical Cavity Surface Emitting Lasers (VCSELs) are often preferred by end-users because of their high coupling efficiency with optical fibers without the need to provide beam shape correction, thus reducing test/packaging costs. VCSELs, however, still have problems with regard to single-mode yield control when manufactured for very high speed operation.

Efforts have also been made in the industry to convert an edge-emitting device into a vertical-emitting device. For example, U.S. Pat. No. 7,245,645 B2 discloses one or both of the laser facets etched at 45° angles to form a 45° mirror that reflects the laser beam vertically. In this solution, however, the 45° mirror is within the laser cavity. U.S. Pat. No. 5,671,243 discloses using conventional 90° laser facets that are outside of the lasing cavity, but in the same chip there is a reflection mirror that turns the beam towards in the direction of the surface. Nevertheless, the inclusion of an etched mirror inside or outside of the laser cavity requires high quality facet etching to be performed during fabrication. Performing high quality etching presents significant reliability issues, especially when performing dry etching under high operating power due to facet damage that can occur during the dry etching process.

U.S. Pat. No. 7,450,621 to the assignee of the present application discloses a solution that overcomes many of the aforementioned difficulties. This patent discloses a semiconductor device in which a diffractive lens is integrated with an edge-emitting laser on the same chip. The diffractive lens is monolithically integrated with the edge-emitting laser on an indium phosphide (InP) substrate material. The monolithic integration of a diffractive lens on the same chip in which the edge-emitting laser is integrated requires the performance of multiple Electron Beam Lithography (EBL) exposure and dry etching processes, which increases device fabrication costs.

It would be desirable to provide a semiconductor device in which an edge-emitting laser is integrated with a diffractive or refractive lens, and which is economical to manufacture.

SUMMARY OF THE INVENTION

The invention is directed to a surface-emitting semiconductor laser device and a method for fabricating the device. The device comprises a substrate having an upper surface and a lower surface, a plurality of semiconductor layers disposed on the substrate, an edge-emitting laser formed in the semiconductor layers for producing laser light of a lasing wavelength, a channel formed in the semiconductor layers, a polymer material disposed in the channel, a refractive or diffractive lens located in or on an upper surface of the polymer material, a side reflector located on the angled side facet of the polymer material generally facing the second end facet of the laser, and a lower reflector located on the upper surface of the substrate generally beneath the lower surface of the polymer material and generally facing the upper surface of the polymer material.

During operations of the laser, at least a portion of the laser light that passes out of the second end facet of the laser propagates through the polymer material and is reflected by the side reflector in a direction generally toward the lower reflector. At least a portion of the reflected laser light is incident on the lower reflector and is re-reflected by the lower reflector in a direction generally towards the refractive or diffractive lens. The refractive or diffractive lens receives at least a portion of the re-reflected laser light and causes the received portion to be directed out of the surface-emitting semiconductor laser device in a direction that is generally normal to the upper surface of the substrate.

The fabrication method comprises depositing or growing a plurality of semiconductor layers on a substrate, forming an edge-emitting laser in one or more of the semiconductor layers for producing laser light of a lasing wavelength, forming a channel in the semiconductor layers, disposing a polymer material in the channel, forming a refractive or diffractive lens in or on the upper surface of the polymer material, disposing a side reflector on the angled side facet of the polymer material generally facing the second end facet of the laser, and disposing a lower reflector on the upper surface of the substrate generally beneath the lower surface of the polymer material and generally facing the upper surface of the polymer material.

These and other features and advantages of the invention will become apparent from the following description, drawings and claims.

DETAILED DESCRIPTION OF AN ILLUSTRATIVE EMBODIMENT

The invention is directed to a surface-emitting semiconductor laser device in which an edge-emitting laser formed in semiconductor material and a diffractive or refractive lens formed in a polymer material are integrated together in the semiconductor laser device. The device includes an edge-emitting laser formed in various layers of semiconductor material disposed on a semiconductor substrate, a polymer material disposed on the substrate laterally adjacent the layers in which the edge-emitting laser is formed, a diffractive or refractive lens formed in or on an upper surface of the polymer material, a side reflector formed on an angled side reflector facet of the polymer material generally facing an exit end facet of the edge-emitting laser, and a lower reflector disposed on the substrate beneath the polymer material. Forming the diffractive or refractive lens and the side reflector in the polymer material rather than monolithically in a semiconductor material eliminates the need to use the aforementioned EBL exposure and etching processes to create these elements. In turn, eliminating the need to use the aforementioned EBL exposure and etching processes to create these elements greatly reduces fabrication costs without decreasing reliability or performance.

Figure 1:
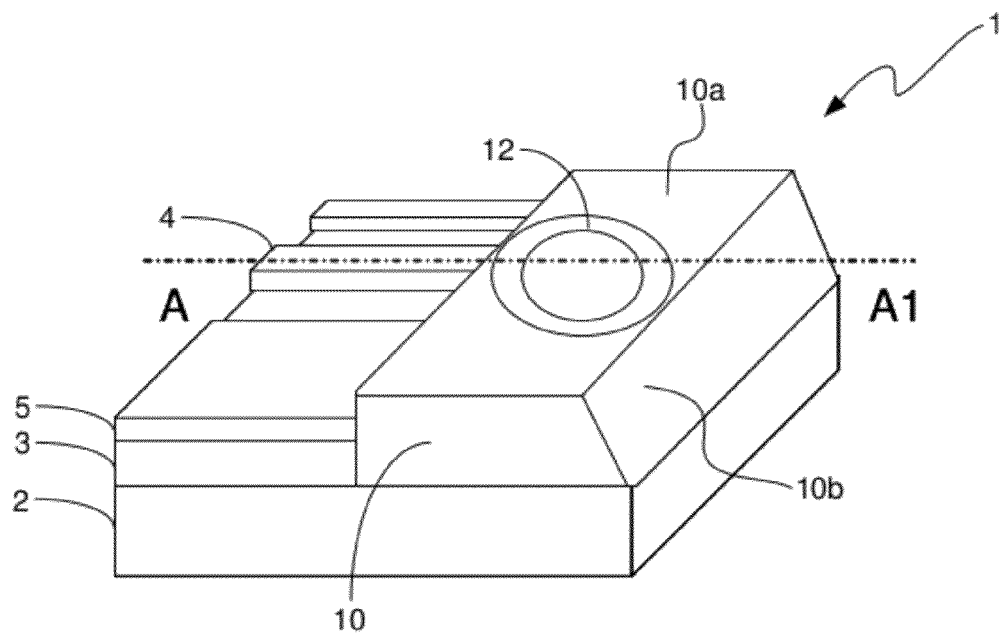
FIG. 1 illustrates a top perspective view of a semiconductor laser device in accordance with an exemplary embodiment of the invention.
Figure 2:
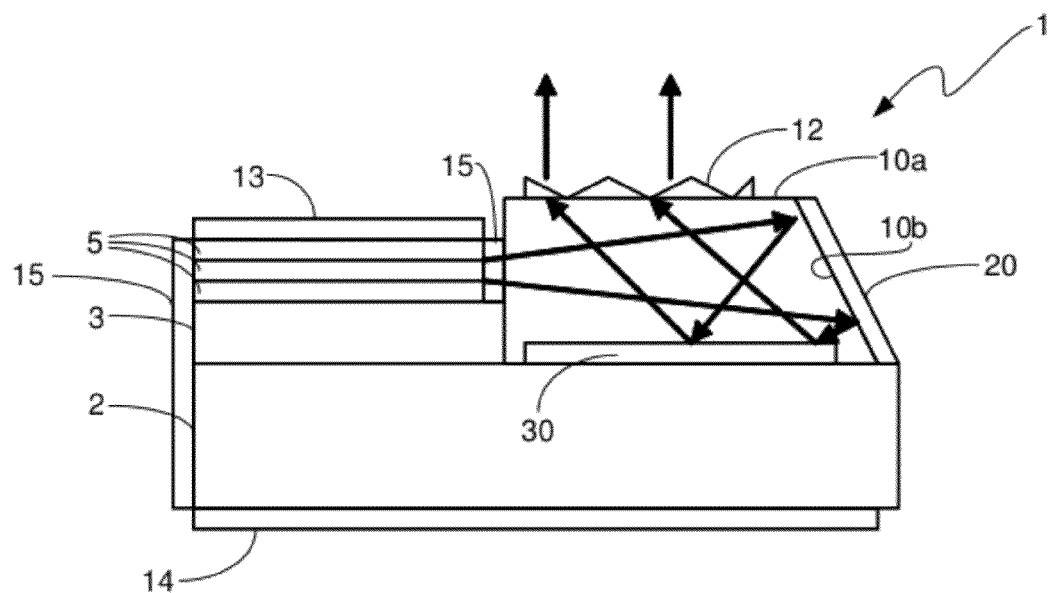
FIG. 2 is a cross-sectional side view of the semiconductor laser device shown in FIG. 1 the taken along line A-A1 of FIG. 1.

FIG. 1 illustrates a perspective view of a semiconductor laser device 1 in accordance with an exemplary embodiment of the invention before the p-metal and n-metal contacts have been formed on the device 1 and before the anti-reflective (AR) and/or highly-reflective (HR) coatings have been formed on the device 1. FIG. 2 illustrates a cross-sectional side view of the semiconductor laser device 1 shown in FIG. 1 taken along line A-A1 of FIG. 1 after the p-metal and n-metal contacts and the AR and/or HR coatings have been formed on the device 1. The semiconductor laser device 1 in accordance with an illustrative embodiment will now be described with reference to FIGS. 1 and 2.

As shown in FIG. 1 (not to scale), in an illustrative or exemplary embodiment of the invention, the laser semiconductor device 1 includes a semiconductor substrate 2, a buffer layer 3 disposed on the upper surface of the substrate 2, an edge-emitting laser 4 formed in one or more active layers 5 that are disposed on top of the buffer layer 3, a polymer material 10 disposed on the upper surface of the substrate 2 laterally adjacent the buffer layer 3 and the active layers 5 in which the edge-emitting laser 4 is formed, a diffractive or refractive lens 12 formed in or on an upper surface 10a of the polymer material 10, and an angled side reflector facet 10b of the polymer material 10.

The material of which the semiconductor substrate 2 is made may be, for example, doped indium phosphide (InP) or gallium arsenide (GaAs). For exemplary purposes, it will be assumed that the semiconductor substrate 2 is made of InP. It will also be assumed that the buffer layer 3 is made of n-type InP. The active layers 5 comprise a multi quantum well (MQW) active region that is grown on top of the buffer layer 3 by a process known as Selective Area Growth (SAG). One or more p-type InP spacer layers, infill layers, and cladding layers (not shown for purposes of clarity) are typically grown on top of the MQW active layers 5. For purposes of clarity and for ease of illustration, these other layers are not shown in the figures. Persons skilled in the art will understand the manner in which such additional layers may be included in the device 1.

With reference to FIG. 2, a p-metal contact 13 is formed on top of the uppermost layer of the device 1 above the active layers 5. An n-metal contact 14 is formed on the lower surface of the substrate 2. Depending on whether the device 1 is being configured as a Fabry-Perot (F-P) laser device or a distributed feedback (DFB) laser device, a coating 15 that is either an HR coating or AR coating, respectively, is formed on the end facets of the edge-emitting laser 4. The edge-emitting laser 4 is typically a ridge structure, such as a reverse-mesa ridge structure, as is known in the art. Methods that may be used to form such a ridge structure are discussed in detail in U.S. Pat. No. 7,539,228, which is assigned to the assignee of the present application and which is incorporated by reference herein in its entirety. As disclosed in this patent, the ridge structure may be etched using convention techniques described in the background of the patent, or grown using techniques described in the detailed description the patent.

An HR coating 20, which forms the aforementioned side reflector, is formed on the angled side reflector facet 10b of the polymer material 10. A metal reflector 30, which forms the aforementioned lower reflector, is disposed on the upper surface of the substrate 2 generally beneath the polymer material 10. The diffractive or refractive lens 12 may be formed in or on the upper surface 10a of the polymer material 10 using known techniques or using techniques such as those described in U.S. Pat. No. 7,450,621, which is assigned to the assignee of the present application and which is incorporated by reference herein in its entirety. The lens 12 may be a refractive optical element, a diffractive optical element, or an optical element that has a combination of refractive and diffractive properties. The manner in which a suitable refractive and/or diffractive optical element may be created for this purpose in the polymer material 10 is well understood by persons skilled in the art.

During operations, the edge-emitting laser 4 emits a light beam generally along an axis that is parallel to the plane of the substrate 2. The laser beam passes out of the exit facet of the laser 4 and enters the polymer material 10, which is transparent to the lasing wavelength. The laser beam is then reflected by the side reflector 20 formed on the angled side reflector facet 10b of the polymer material 10 in the direction generally toward the lower reflector 30. The beam is re-reflected by the lower reflector 30, which is typically a metal mirror, in the direction generally toward the upper surface 10a, where it is collected and collimated by the lens 12. Accordingly, a beam emerges from the device 1 oriented along an axis that is substantially perpendicular to the upper surface 10a of the polymer material 10, i.e., substantially perpendicular to the upper surfaces of the device 1. For this reason, the device 1 can be referred to as a "surface-emitting" device.

FIGS. 3A-3J illustrate an example of a series of fabrication steps that may be used to fabricate the semiconductor laser device 1 shown in FIGS. 1 and 2. The device 1 can be fabricated using conventional techniques. Exemplary or illustrative steps for making a ridge structure laser with a polymer lens are illustrated in FIGS. 3A-3J, but the order of the steps depicted in these figures is used herein only for purposes of illustration, and the steps can be performed in any other suitable order. Furthermore, additional steps of the type commonly used in fabricating such devices can be included, as persons skilled in the art will readily appreciate.

FIGS. 3A-3F are top perspective views of the device 1 shown in FIG. 1 at various stages during the fabrication process during which a channel 40 and a ridge structure 50 are formed in the device 1. FIG. 3G is a side plan view of the device 1 at the processing stage shown in FIG. 3F, but after an HR or AR coating has been applied thereto, depending on whether the device 1 is being configured as an F-P laser device or as a DFB laser device, respectively. FIG. 3H is a top perspective view of the device 1 shown in FIG. 3G after portions of the HR or AR coating 15 have been removed to form the p-metal and n-metal contacts 13 and 14, respectively, and after the lower reflector 30 has been deposited in a portion of the channel 40. FIG. 3I is a top perspective view of the device 1 shown in FIG. 3H after the polymer material 10 has been deposited in the channel 40 and shaped. FIG. 3J is a top perspective view of the device 1 shown in FIG. 3I after the diffractive or refractive lens 12 has been formed in or on the upper surface 10a of the polymer material 10. The fabrication process will now be described with reference to FIGS. 3A-3J.

Figure 3A:
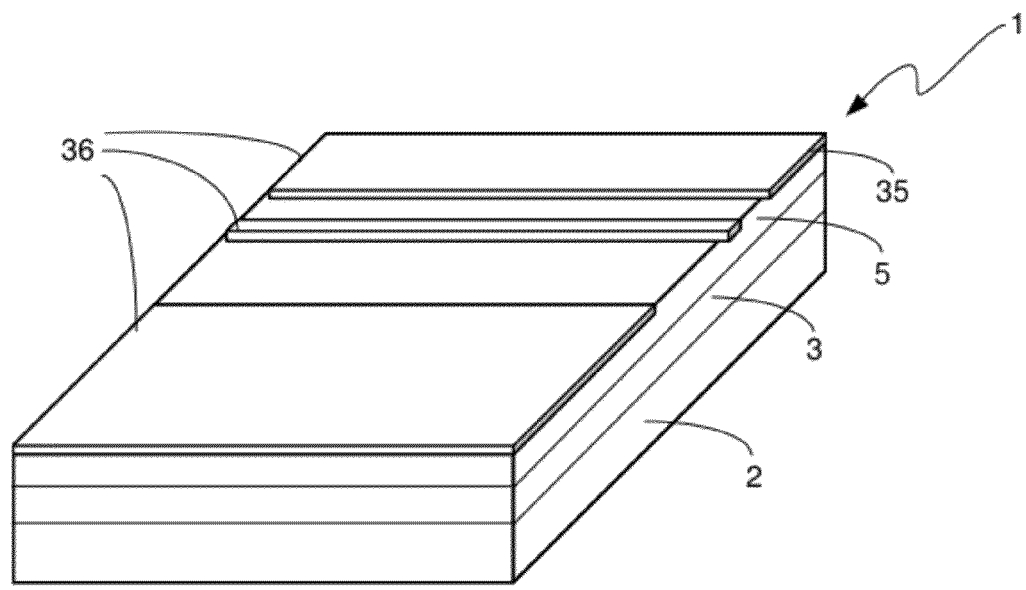
FIGS. 3A-3J together illustrate a sequence of process steps that may be used to fabricate the semiconductor laser device shown in FIG. 1.
Figure 3B:
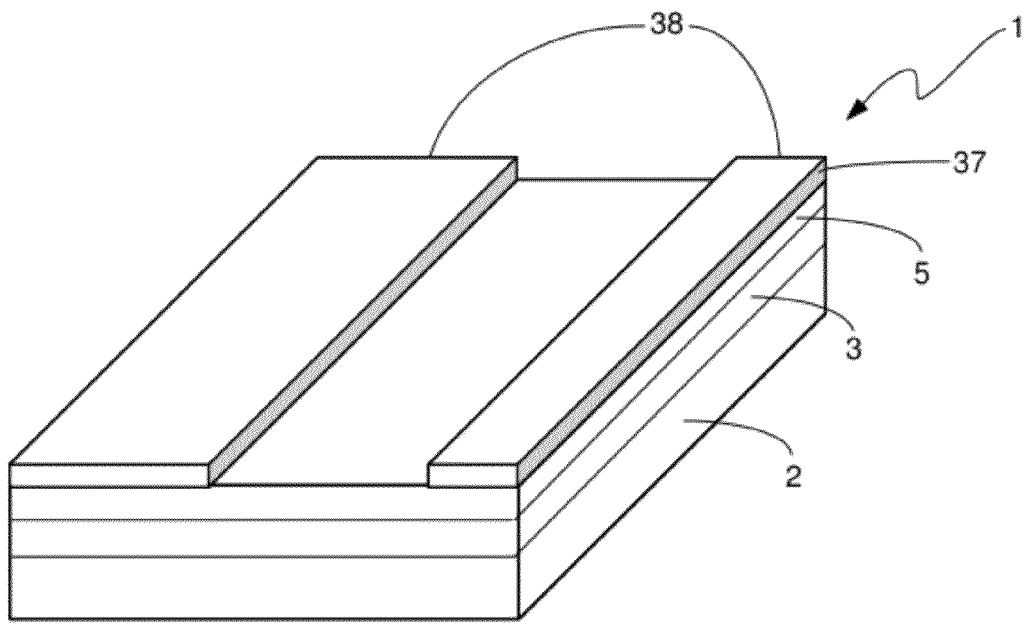
Figure 3C:
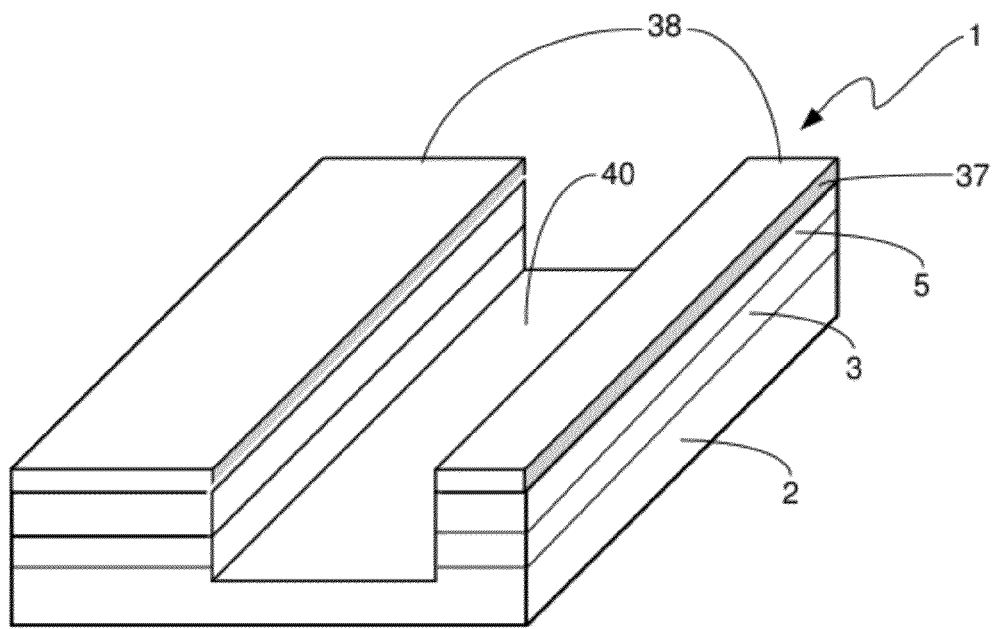
Figure 3D:
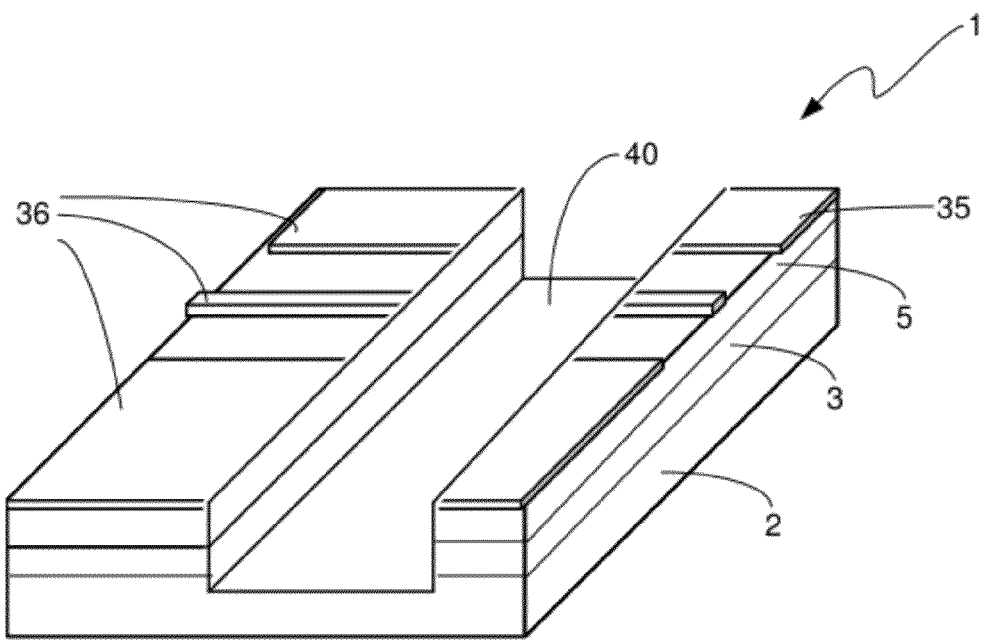
Figure 3E:
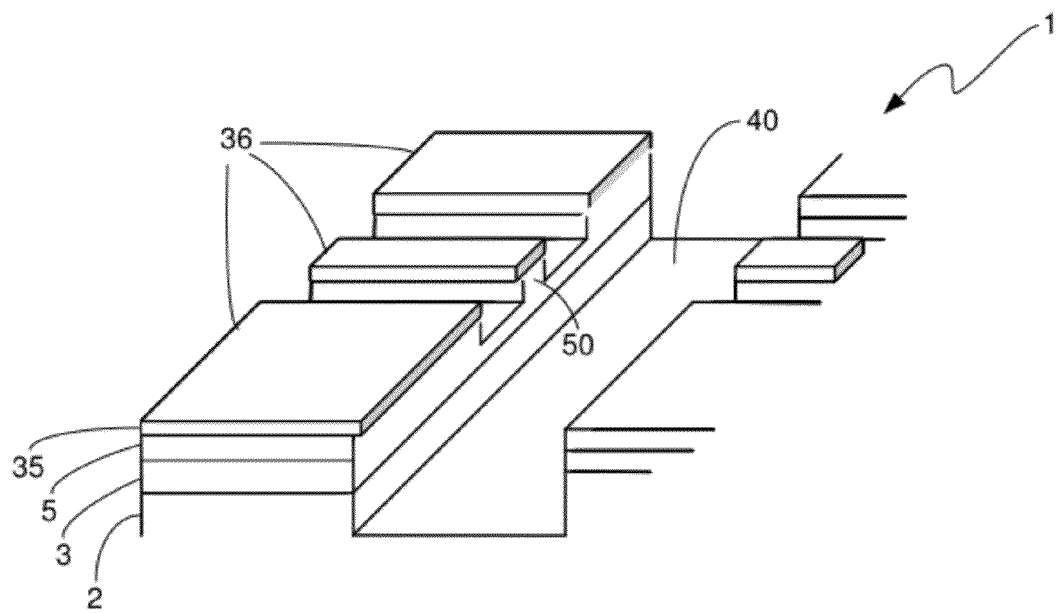
Figure 3F:
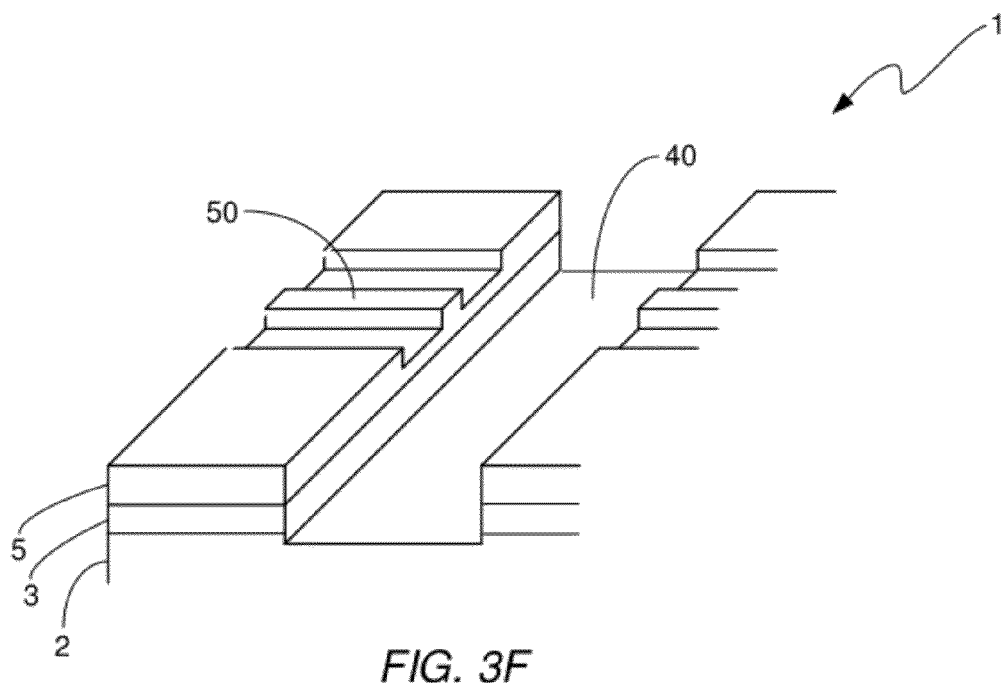
Figure 3G:
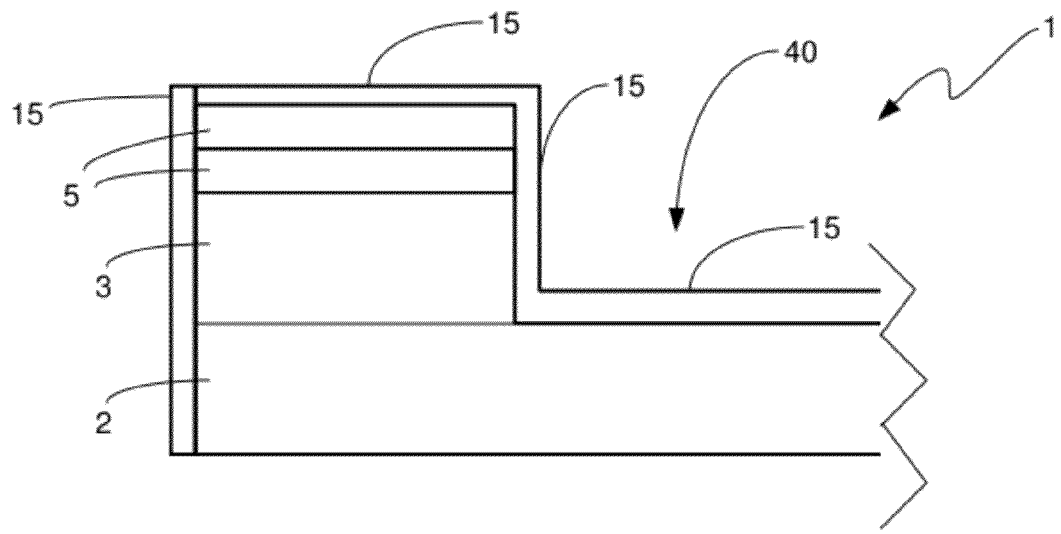
Figure 3H:
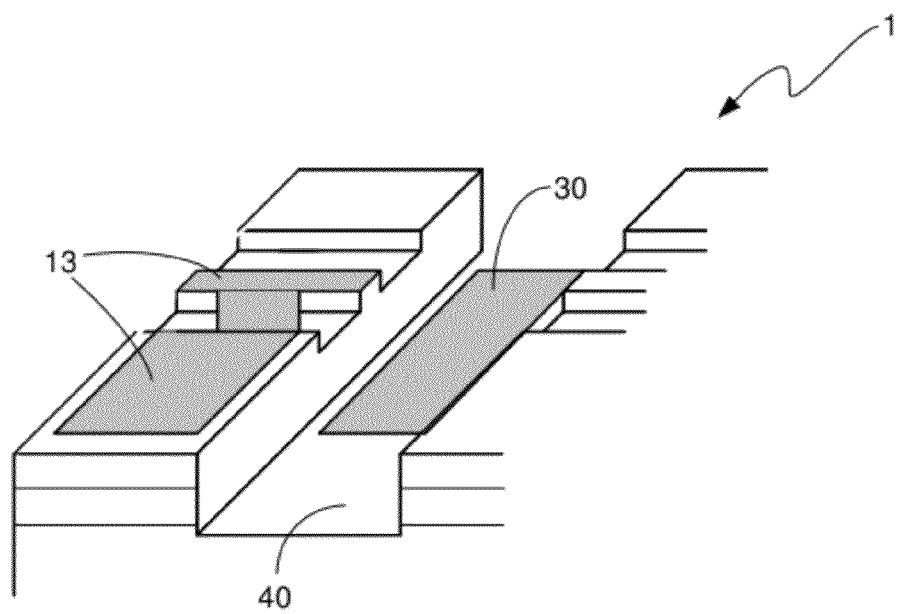
Figure 3I:
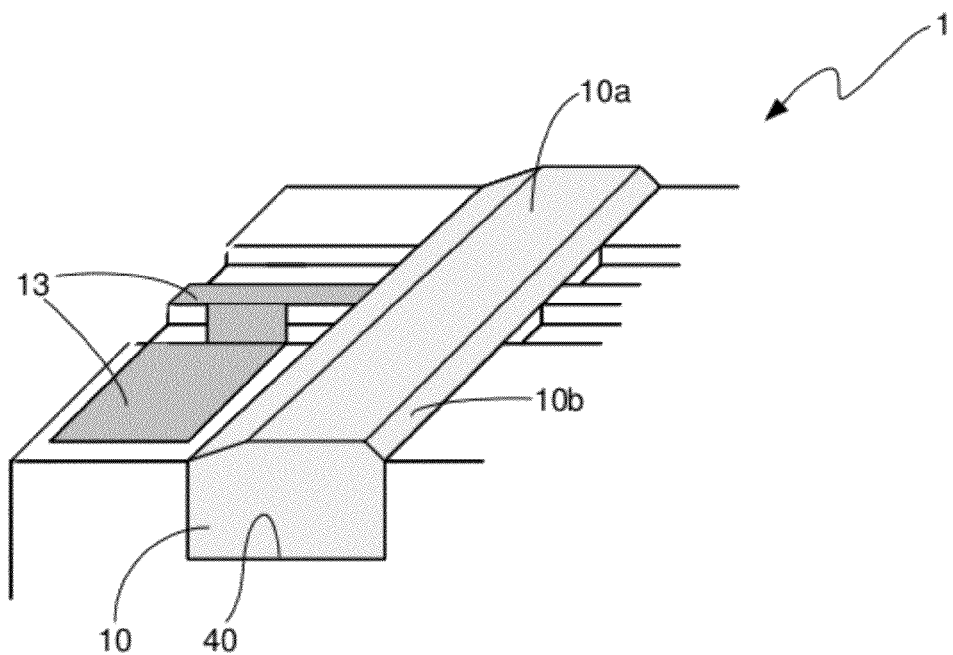
Figure 3J:
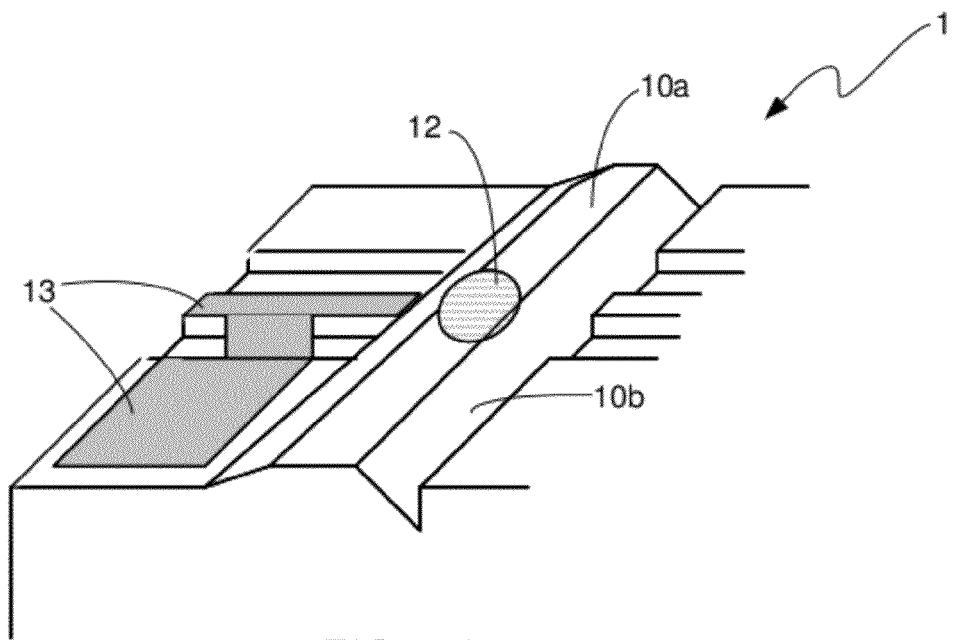

Like numerals in FIGS. 1 and 2 and 3A-3J are used to refer to like elements or features. With reference to FIG. 3A, a first dielectric film 35, which is typically, but not necessarily, a silicon dioxide ($SiO_2$) film, is deposited on top of the active layers 5 (FIG. 1), or on top of any layers that are on top of the active layers 5 (e.g., infill layers, cladding layers, etc.). A ridge mask pattern 36 that will be used to define the location and configuration of a ridge structure is formed in the dielectric film 35 using conventional photolithography and dry etch techniques. With reference to FIG. 3B, a second dielectric film 37, which is typically, but not necessarily, $SiO_2$, is deposited over the ridge mask pattern 36 and subjected to conventional photolithography and dry etch techniques to form a channel mask pattern 38 that will subsequently be used to define a channel. With reference to FIG. 3C, the device 1 shown in FIG. 3B is etched, typically by using an Inductive Coupled Plasma (ICP) etching process, to form the channel 40. An advantage of using an ICP etching process for this purpose is that it causes very little damage to layers that are adjacent the etched region while maintaining a good vertical sidewall profile for the vertical sides that define the channel 40.

With reference to FIG. 3D, the channel mask pattern 38 shown in FIG. 3C is removed by using a Reactive Ion Etching (RIE) process, leaving only the ridge mask pattern 36 shown in FIG. 3A and the channel 40 shown in FIG. 3C. With reference to FIG. 3E, RIE or ICP is then used to form the ridge structure 50 without the need for a further photolithographic alignment. With reference to FIG. 3F, the etched ridge mask pattern 36 is then removed to expose the ridge 50.

With reference to the side view shown in FIG. 3G, the device 1 is coated with an HR or AR coating 15 (FIG. 2). Typically, hundreds or thousands of the devices 1 are simultaneously fabricated on a wafer (not shown for purposes of clarity), in which case the entire wafer may be coated with the HR or AR coating 15. This is in contrast to the standard process in which the HR or AR coating is applied after the wafer has been sawed and singulated into the individual devices 1. With reference to FIG. 3H, the HR or AR coating 15 is etched to remove unwanted portions of the coating 15 such that the only portion of the coating 15 that remains is the p-metal contact 13 (FIG. 2). A metal layer 30 is then deposited in the channel 40 to form the lower reflector 30 (FIG. 2).

With reference to FIG. 3I, after the lower reflector 30 has been formed in the channel 40, the channel 40 is filled with the polymer material 10. With reference to FIG. 3J, the diffractive or refractive lens 12 (FIGS. 1 and 2) and the angled facet 10b are formed in or on the polymer material 10 via either standard photolithography/etch techniques or an imprinting technique, the latter of which uses a master mask (not shown for purposes of clarity) having a shape and that is complementary to the desired shape of the polymer material 10 with the lens 12 and angled facet 10b formed therein. The imprinting technique is preferred because it is a low-cost fabrication technique that allows the overall cost associated with fabricating the device 1 to be greatly reduced. After the lens 12 and the angled facet 10b have been formed in the polymer material 10, as shown in FIG. 3J, the side reflector 20 (FIG. 2), which is typically an HR coating, is formed on the angled facet 10b. For purposes of clarity, the side reflector 20 is not shown in FIG. 3J.

Figure 4:
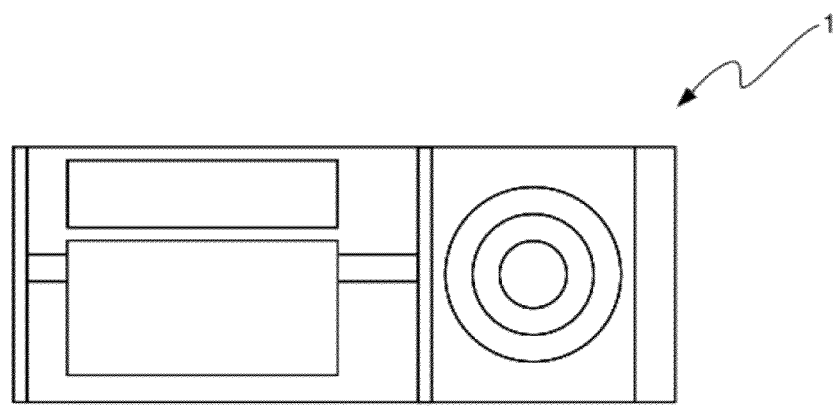
FIG. 4 illustrates a top plan view of the semiconductor laser device shown in FIG. 1 with both the p-metal contact and the n-metal contact positioned on the top side of the device.

FIG. 4 illustrates a top plan view of the device 1 shown in FIG. 2 except that both the p-metal and n-metal contacts 13 and 14 are formed on the top side of the device 1, i.e., on the upper most layer above the active layers 5 (FIG. 2). This is in contrast to the configuration shown in FIG. 2 in which the p-metal contact 13 is disposed on top of the uppermost layer of the device 1 and the n-metal contact 14 is disposed on the lower surface of the substrate 2. FIG. 4 is merely an example of one of many possible modifications that may be made to the device 1 shown in FIG. 2. Persons skilled in the art will understand the manner in which these and a variety of other modifications may be made to the device 1 without deviating from the scope of the invention.

Figure 5:
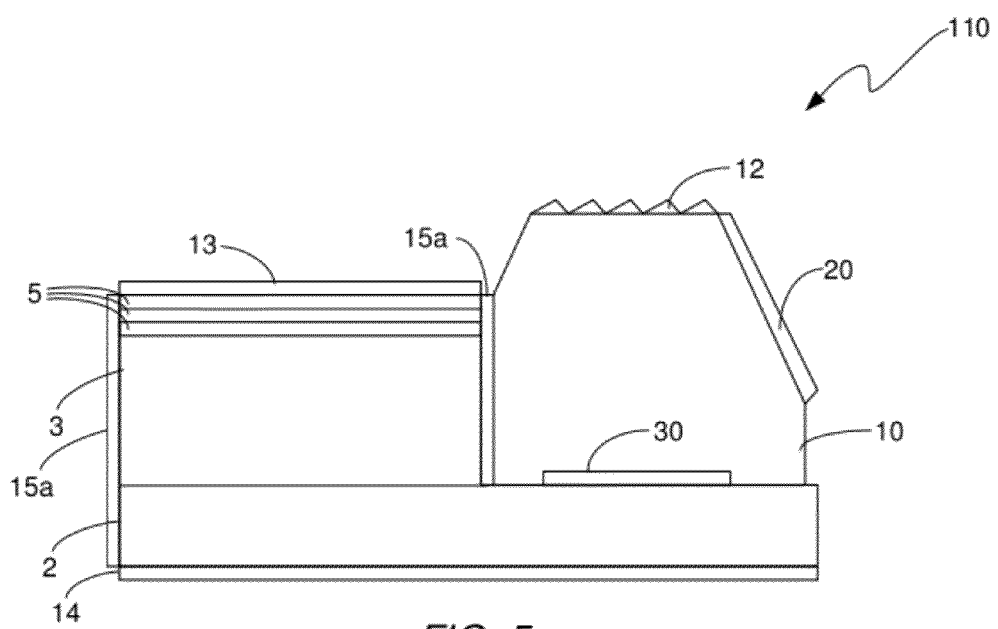
FIG. 5 illustrates a side cross-sectional view of the semiconductor laser device shown in FIG. 1 in an example in which the device is configured as a Fabry-Perot laser device having high reflectivity (HR) coatings on the etched laser facets of the device.
Figure 6:
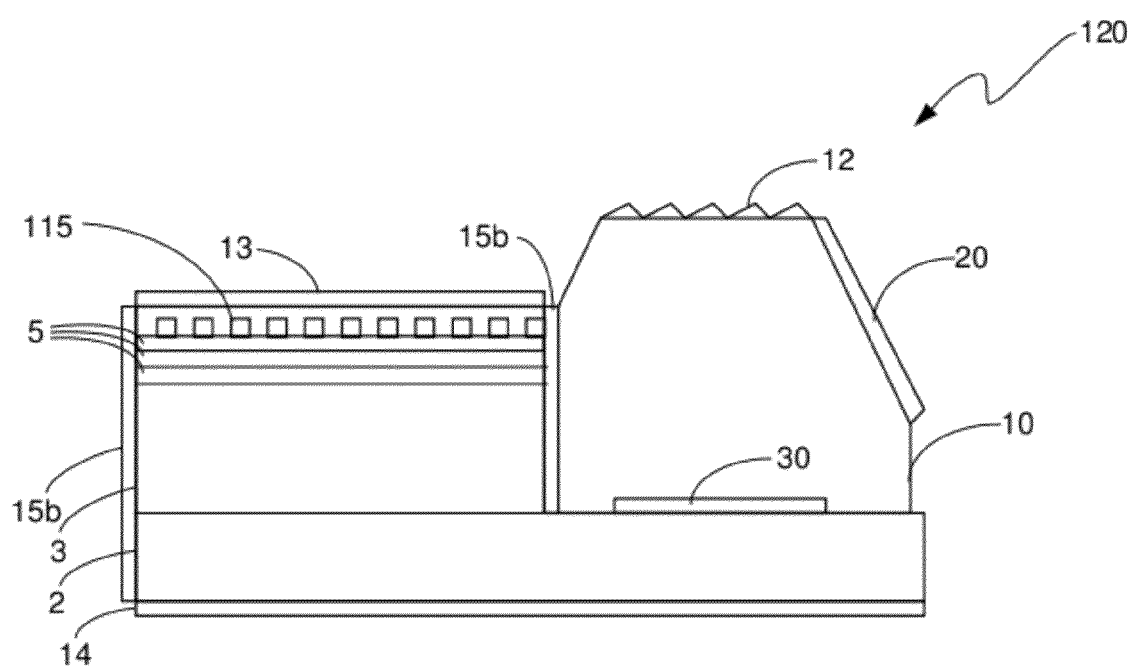
FIG. 6 illustrates a side cross-sectional view of the semiconductor laser device shown in FIG. 1 in an example in which the device is configured as a distributed feedback laser device having anti-reflection (AR) coatings on the etched laser facets of the device.

As indicated above, the device 1 may be configured as an F-B semiconductor laser device or as a DFB semiconductor laser device. FIGS. 5 and 6 illustrate side cross-sectional views of the device 1 configured as an F-P semiconductor laser device 110 and as a DFB semiconductor laser device 120, respectively. The F-P semiconductor laser device 110 may be identical to the device 1 shown in FIGS. 1 and 2. The F-P semiconductor laser device 110 has HR coatings 15a on the laser end facets. The F-P laser itself may be a ridge structure 4, just as in the embodiment described above with reference to FIGS. 1 and 2. The DFB semiconductor laser device 120 may be identical to the device 1 shown in FIGS. 1 and 2, except that it does not incorporate the ridge structure 4, but rather, utilizes a buried diffraction grating 115. In the DFB semiconductor laser device 120, AR coatings 15b are used on the laser end facets.

The invention has been described with reference to a few illustrative or exemplary embodiments for the purposes of describing the principles and concepts of the invention. The invention, however, is not limited to these embodiments, as will be understood by persons skilled in the art in view of the description provided herein. For example, while the substrate 2 and other layers of the devices 1, 110 and 120 have been described as using InP, the substrate 2 and the other layers may comprise any suitable material, such as GaAs, aluminum gallium (AlGa), aluminum gallium indium arsenide (AlGaInAs), etc. In addition, various other metal configurations may be used for the p-metal and n-metal contacts. The laser operation may be a single transverse mode or a multimode operation (FIG. 5), or a longitudinally single mode operation (FIG. 6), or a combination of other integrated operational devices (e.g., modulators, amplifiers, waveguides, etc.). Those skilled in the art will understand that various modifications may be made to the embodiments described herein and that it is intended that the present invention cover all such modifications and variations.

What is claimed is:

1. A surface-emitting semiconductor laser device comprising:
    a substrate having an upper surface and a lower surface;
    a plurality of semiconductor layers comprising at least a lowermost layer and an uppermost layer, wherein the lowermost layer is disposed on the upper surface of the substrate, said plurality of semiconductor layers having an edge-emitting laser formed therein for producing laser light of a lasing wavelength when the laser is activated, the laser having first and second end facets, wherein the laser light of the lasing wavelength passes out of the laser through the second end facet when the laser is activated;
    a channel formed in said plurality of semiconductor layers;
    a polymer material disposed in the channel, the polymer material including at least an upper surface, a lower surface and an angled side facet;
    a refractive or diffractive lens located in or on the upper surface of the polymer material;
    a side reflector located on the angled side facet of the polymer material generally facing the second end facet of the laser; and
    a lower reflector located on the upper surface of the substrate generally beneath the lower surface of the polymer material and generally facing the upper surface of the polymer material, wherein at least a portion of the laser light that passes out of the second end facet of the laser propagates through the polymer material and is reflected by the side reflector in a direction generally toward the lower reflector, and wherein at least a portion of the reflected laser light is incident on the lower reflector and is re-reflected by the lower reflector in a direction generally towards the refractive or diffractive lens, and wherein the refractive or diffractive lens receives at least a portion of the re-reflected laser light and causes the received portion to be directed out of the surface-emitting semiconductor laser device in a direction that is generally normal to the upper surface of the substrate.

2. The surface-emitting semiconductor laser device of claim 1, wherein said refractive or diffractive lens is a refractive lens.

3. The surface-emitting semiconductor laser device of claim 1, wherein said refractive or diffractive lens is a diffractive lens.

4. The surface-emitting semiconductor laser device of claim 1, wherein said refractive or diffractive lens is a lens having a combination of refractive and diffractive properties.

5. The surface-emitting semiconductor laser device of claim 1, wherein the edge-emitting laser comprises a ridge structure formed by etching through at least a portion of said plurality of semiconductor layers.

6. The surface-emitting semiconductor laser device of claim 5, wherein the edge-emitting laser is a fabry-Perot (F-P) laser.

7. The surface-emitting semiconductor laser device of claim 6, further comprising:
    a highly-reflective (HR) coating disposed on the first and second end facets.

8. The surface-emitting semiconductor laser device of claim 1, wherein the edge-emitting laser comprises a buried diffractive grating formed in one or more of said plurality of semiconductor layers.

9. The surface-emitting semiconductor laser device of claim 8, wherein the edge-emitting laser is a distributed feedback (DFB) laser.

10. The surface-emitting semiconductor laser device of claim 8, further comprising:
    An anti-reflective (AR) coating disposed on the first and second end facets.

11. A method of fabricating a surface-emitting semiconductor laser device, the method comprising:
    on a substrate, depositing or growing a plurality of semiconductor layers comprising at least a lowermost layer and an uppermost layer, wherein the lowermost layer is disposed on the upper surface of the substrate;
    in one or more of said plurality of semiconductor layers, forming an edge-emitting laser for producing laser light of a lasing wavelength, the laser having first and second end facets, wherein if the laser is activated, laser light produced by the laser passes out of the laser through the second end facet;
    forming a channel in said plurality of semiconductor layers;
    disposing a polymer material in the channel, the polymer material including at least an upper surface, a lower surface and an angled side facet;
    forming a refractive or diffractive lens in or on the upper surface of the polymer material;
    disposing a side reflector on the angled side facet of the polymer material generally facing the second end facet of the laser; and
    disposing a lower reflector on the upper surface of the substrate generally beneath the lower surface of the polymer material and generally facing the upper surface of the polymer material.

12. The method of claim 11, wherein said refractive or diffractive lens is a refractive lens.

13. The method of claim 11, wherein said refractive or diffractive lens is a diffractive lens.

14. The method of claim 11, wherein said refractive or diffractive lens is a lens having a combination of refractive and diffractive properties.

15. The method of claim 11, further comprising:
    forming a highly-reflective (HR) coating on the first and second end facets, and wherein the edge-emitting laser comprises a ridge structure formed by etching through at least a portion of said plurality of semiconductor layers.

16. The method of claim 15, wherein the edge-emitting laser is a fabry-Perot (F-P) laser.

17. The method of claim 11, further comprising:
    forming an anti-reflective (AR) coating on the first and second end facets, wherein the edge-emitting laser comprises a buried diffractive grating formed in one or more of said plurality of semiconductor layers.

18. The method of claim 17, wherein the edge-emitting laser is a distributed feedback (DFB) laser.

* * * * *